United States Patent

Beex

[11] 4,232,192  
[45] Nov. 4, 1980

[54] MOVING-AVERAGE NOTCH FILTER

[75] Inventor: Aloysius A. Beex, Hopkins, Minn.

[73] Assignee: Starkey Labs, Inc., Minneapolis, Minn.

[21] Appl. No.: 901,771

[22] Filed: May 1, 1978

[51] Int. Cl.$^2$ .............................................. H04R 3/02
[52] U.S. Cl. .................................. 179/1 FS; 179/1 D
[58] Field of Search ................. 179/1 FS, 1 D, 107 R; 333/17, 18, 70 T; 364/724

[56] References Cited

U.S. PATENT DOCUMENTS

| | | | |
|---|---|---|---|
| 3,755,749 | 8/1973 | Van Ryswyk et al. | 179/1 FS |
| 3,763,333 | 10/1973 | Lichowski | 179/1 F |
| 4,079,199 | 3/1978 | Patronis, Jr. | 179/1 FS |
| 4,088,835 | 5/1978 | Thurmond et al. | 179/1 FS |
| 4,091,236 | 5/1978 | Chen | 179/1 FS |

OTHER PUBLICATIONS

S. Freeny, "Special Purpose Hardware for Digital Filtering," Proc. IEEE, Apr. 1975, pp. 633–636.

J. Proakis, "Adaptive Digital Filters," IEEE Trans. Audio/Electro, Jun. 1970, pp. 195–200.

*Primary Examiner*—Malcolm A. Morrison
*Assistant Examiner*—E. S. Kemeny
*Attorney, Agent, or Firm*—Craig & Antonelli

[57] ABSTRACT

A moving-average notch filter with a well-defined phase characteristic for use in eliminating oscillation frequencies in a sound amplification system, wherein this moving-average filter is designed to have an output $Y_K$ in accordance with the system equation $$Y_K = \sum_{i=0}^{M} b_i X_{K-i},$$

where $b_i$ are the weighting coefficients, $X_{K-i}$ are input samples, and K is a constant. This filter may be designed to have a linear phase characteristic. In one embodiment, the location of the notch in the frequency response of the filter may be made to automatically track the drift of an acoustic oscillation frequency.

19 Claims, 9 Drawing Figures

MOVING-AVERAGE NOTCH FILTER

BACKGROUND OF THE INVENTION

1. Field of the Invention

This invention relates generally to sound amplification systems, and more particularly to a stable filter for eliminating acoustic feedback in such systems.

2. Description of the Prior Art

The present invention finds applications in a variety of sound amplification systems, including public address systems and other situations in which there is substantial sound amplification and related feedback oscillation problems. However, because the present invention is especially well suited to hearing aid applications, the invention will be explained in the context of a hearing aid system.

Figure 1:
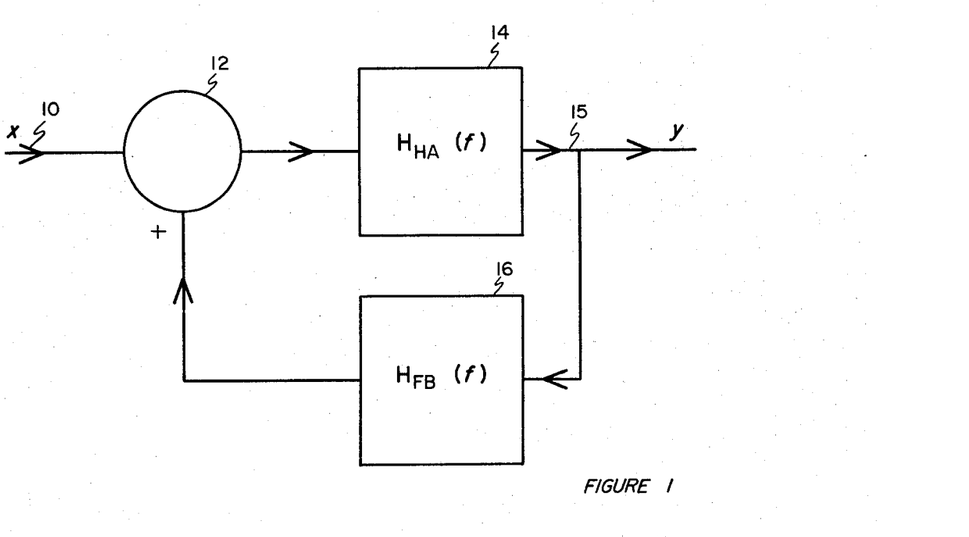
FIG. 1 is a block diagram illustrating the transfer function feedback configuration in a typical sound system.

As is well known in the hearing aid art, each instrument has associated with it the capability of oscillation when some of the output signal from the instrument is fed back acoustically into the microphone. This situation is illustrated in block diagram form in FIG. 1, wherein numeral 14 designates a hearing aid with a transfer function $H_{HA}(f)$ having an input x on line 10 and an output y on line 15. For purposes of explanation, it will be assumed that this particular hearing aid system is a linear system. A feedback path with a transfer function $H_{FB}(f)$ is generally obtained by either mechanical coupling of the receiver and the microphone transducers in the hearing aid itself, or more commonly, by virtue of a leak between the ear canal and the ear mold. For mechanical coupling, the feedback transfer function can be modeled as $H_{FB}(f) = \alpha$. For ear canal leakage, the feedback transfer function can be modeled as $H_{FB}(f) = \alpha e^{-j2\pi f \tau}$. Both of the above-noted models are based on the assumption that $|\alpha| \leq 1$. This feedback transfer function is shown in FIG. 1 by the numeral 16 which takes an input from the output line 15 and applies its output signal as one input to an adder 12 which has the input line 10 as its other input. The transfer function of the total system shown in FIG. 1 thus becomes:

$$H(f) = \frac{H_{HA}(f)}{1 - H_{FB}(f) \cdot H_{HA}(f)} \tag{1}$$

In order to obtain stability for the above feedback system, the poles of the above-noted transfer function, equation 1, are required to have negative real parts. If the poles of this transfer function do not have negative real parts, then instability will occur at the characteristic roots of the complex denominator polynomial:

$$1 - H_{FB}(f) \cdot H_{HA}(f) = 0 \tag{2}$$

This equation translates to two real counterparts:

$$1 - |H_{FB}(f)| \cdot |H_{HA}(f)| = 0 \tag{3}$$

and $$\theta_{FB}(f) + \theta_{HA}(f) = n \cdot 2\pi; \text{ in radians}; n = 0, 1, 2 \tag{4}$$

Equations 3 and 4 determine when and where this feedback instability will occur. In hearing aids which are designed for providing gain, the quantity $|H_{HA}(f)|$ may be very large. For both feedback path models noted above, the feedback magnitude function $|H_{FB}(f)| = \alpha$. Thus, according to equation 3, $\alpha$ must be made as small as possible in order to allow the highest hearing aid gain to be realized before feedback occurs. However, there are physical limits to the smallness of $\alpha$ because ear canal leaks cannot be totally prevented. Thus, according to equation 3, the magnitude function $|H_{HA}(f)|$ representing the hearing aid gain must be limited if no feedback oscillation is to occur.

Figure 2:
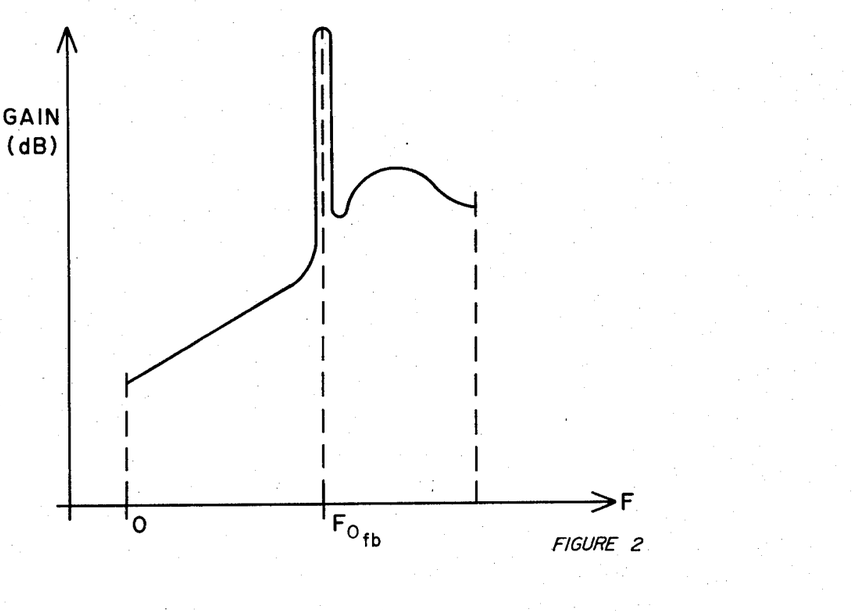
FIG. 2 is a graphical representation of a typical frequency response with an acoustic feedback oscillation at one frequency.

The frequency response of the total system with feedback is shown in FIG. 2 wherein there is a single oscillation feedback frequency $f_{fb}$ in the frequency band of interest. For a system with the frequency response shown in FIG. 2, it is apparent that a solution to this feedback oscillation problem would be to use a notch filter to modify the magnitude function $|H_{HA}(f)|$, such that the resulting transfer function vanishes at the oscillation frequency. This notch filter may be represented by a transfer function:

$$H_{NOTCH}(f) = |H_{NOTCH}(f)| e^{j\theta_{NOTCH}(f)} \tag{5}$$

Figure 3:
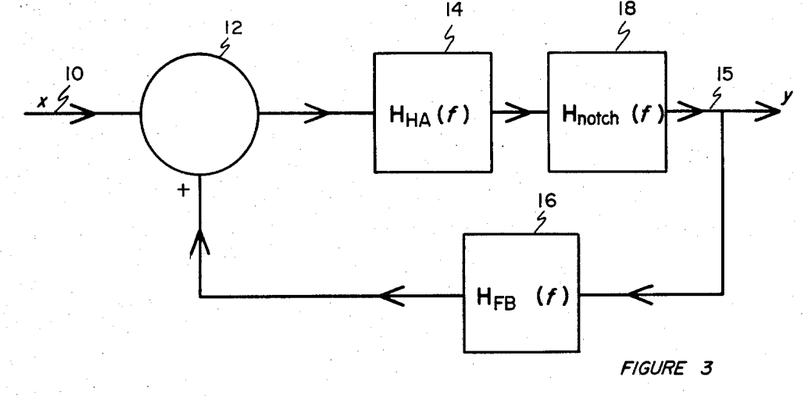
FIG. 3 is a block diagram of the transfer function of a sound system having acoustic feedback and a notch filter.

The modified block diagram now appears as shown in FIG. 3. The only change in this figure has been the addition of the transfer function 18 representing the transfer function of the notch. Using a derivation analogous to the derivation for equations 3 and 4, the following stability equations can be obtained for the system of FIG. 3:

$$1 - |H_{FB}(f)| \cdot |H_{HA}(f)| \cdot |H_{NOTCH}(f)| = 0 \tag{6}$$

and $$\theta_{FB}(f) + \theta_{HA}(f) + \theta_{NOTCH}(f) = n \cdot 2\pi n = 0, 1, 2, \tag{7}$$

By making the magnitude function $|H_{NOTCH}(f)|$ very small for a particular oscillation frequency it appears possible to eliminate that oscillation frequency.

We have not discussed the equations 4 and 7 in connection with the determination of the proper notch transfer function. However, these equations determine where in the frequency range the oscillations will occur, if they occur at all.

The conventional notch filter is typically an analog filter comprising a cascade of several second order sections each with a transfer function as follows:

$$H_{CONV}(S) = \frac{s^2 + \omega_0^2}{s^2 + s \frac{\omega_0}{Q} + \omega_0^2} \tag{8}$$

Figure 4:
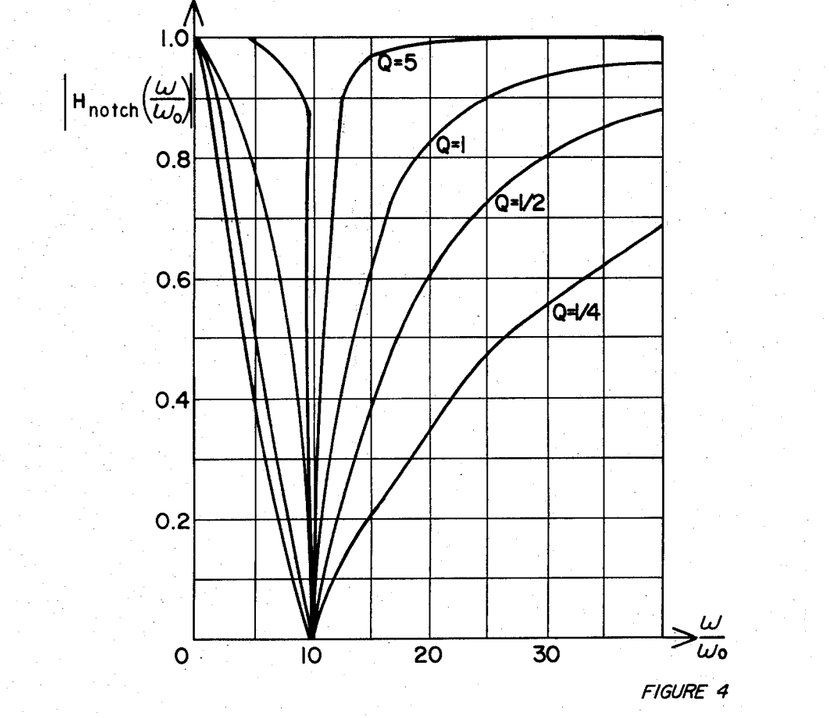
FIG. 4 is a graphical representation of the magnitude response of a conventional notch filter utilizing a second order section.
Figure 5:
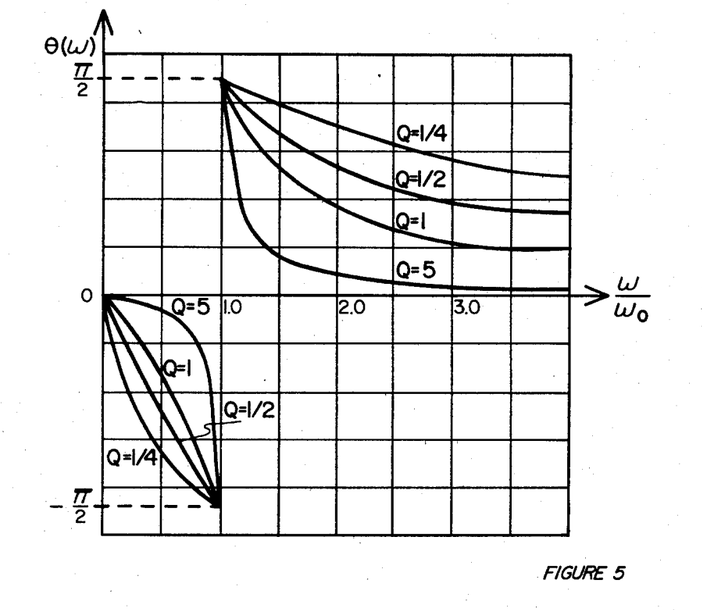
FIG. 5 is a graphical representation of the phase characteristic of a conventional notch filter utilizing a second order section.

Each of these second order functions will exhibit a transfer function magnitude $|H_{CONV}(f)|$ as shown in FIG. 4, and a phase characteristic as shown in FIG. 5. It is clear from a review of FIG. 5, that at the notch frequency $\omega_N$, where $\omega_N/\omega_0 = 1$, the phase characteristic jumps by $\pi$ radians. Thus, exactly at the notch frequency $f_N$, where ideally the magnitude of the transfer function $|H_{NOTCH}(f)|$ vanishes, the phase characteristic $\theta_{CONV}(f)$ is not precisely determined. The effect of the indeterminate nature of the phase characteristic of this notch filter is that the equation 7 will no longer be a limit on the number of frequency solutions to the equation 6 which will cause feedback oscillation. Since the high gain of the typical hearing aid will cause the equation 6 to be satisfied by a number of frequencies, the system will oscillate at any one of these frequencies and still satisfy equation 7.

In practical circumstances, the conventional notch filter can be slightly misadjusted, so as to have the notch occur a little above or a little below the initial frequency of oscillation. A review of the phase characteristics shown in FIG. 5 demonstrates that the phase at the notch frequency now is determined. Therefore, the solutions to equations 6 and 7 will permit only a finite set of oscillation frequencies to occur. However, from a review of the magnitude of the transfer function shown in FIG. 4, it can be seen that this slight misadjustment will cause only a small gain reduction at the oscillation frequency $f_N$. Thus, the corresponding gain increase in $|H_{HA}(f)|$ will be limited to a few db at most.

Various attempts have been made to solve this acoustic feedback problem in conjunction with other design goals. By way of example, a copending application by Graupe, Beex and Causey, Ser. No. 660513, filed on Feb. 23, 1976, deals with an auto-regressive type or recursive filter for tailoring the frequency response of a filter to a desired frequency response required to compensate for the defects in the frequency spectrum of a particular listener. Any digital filter of the recursive type must have a method of sampling inputs (i.e., sound levels at various times) and combining the information gained from that sampling method to arrive at the control exercised by the system. Such digital filters of the recursive type not only sample and use data from the environment being sampled, but also make a computation based on prior computations. The filter disclosed in the above-noted application is characterized in that generally less samples are required in order to obtain the particular filter frequency response desired. Such a smaller number of required samples is made possible by the use of the recursive feedback of the system which provides additional terms which vary in accordance with $Y_{(K-1)}$, $Y_{(K-2)}$, etc. This type of filter can be specifically designed to have a notch to remove acoustic feedback frequencies. However, this type of filter can be unstable at certain frequencies because of the poles in its transfer function. This instability would become apparent when the sampled inputs to the recursive filter are consecutively zero for several readings, because there will then be an output even though the inputs have remained zero over a prolonged period of time. In comparison with a moving-average filter this type of filter is generally more sensitive to parameter variations due to the fewer parameters used in the system. That is, the changes in frequency response caused by temperature drift and other component tolerances will be much larger in comparison, and in some cases, could drive a stable system to instability. Moreover, with a recursive filter as disclosed in the above-noted application it is not possible to obtain exact linear phase response. (See the Rabiner and Gold reference noted hereinafter, at page 206). Additionally, the mere existence of poles in a filter transfer function will cause that transfer function to have rapidly changing phase characteristics at the location of the poles. See Rabiner and Gold, page 824. Since a notch implementation in a recursive filter will generally require a pole location directly adjacent to the notch itself, this will cause the phase characteristic at the notch frequency to be subject to rapid changes, or even indeterminate behavior as in conventional analog filters.

OBJECTS OF THE INVENTION

An object of the present invention is to substantially eliminate the gain of a sound system at the oscillation frequency or frequencies for that system by means of a filter which is inherently stable.

A further object of the present invention is to remove a feedback oscillation frequency or frequencies from a sound amplification system transfer function by means of a filter with a well-defined phase characteristic.

Another further object of the present invention is to remove a feedback oscillation frequency from a sound system transfer function by means of a filter with a linear phase characteristic.

A still further object of the present invention is to construct a moving-average filter to prevent occurrence of the feedback oscillation frequency of a sound system.

A yet further object of the present invention is to prevent the feedback oscillation frequency in a sound system from occurring with a filter which automatically adjusts its notch to remove a changing feedback oscillation frequency.

SUMMARY OF THE INVENTION

In order to achieve the foregoing objects, the present invention sets forth a sound amplification system including a moving-average filter with an output derived according to the system equation $$Y_K = \sum_{i=0}^{M} b_i x_{K-i-S},$$

wherein the system has a well-defined phase characteristic for removing feedback oscillation frequencies in the system. This moving-average filter may be designed to have a linear phase characteristic. In one embodiment of this invention, this moving-average filter may be designed to automatically move the notch for cancellation of the feedback oscillation frequency in accordance with changes in that feedback oscillation frequency.

DETAILED DESCRIPTION OF THE PREFERRED EMBODIMENT

The sound amplification system of the present invention focuses primarily on the phase relationship of the signals transmitted therethrough in contradistinction to a focus on the amplitude characteristics of the signal as in the prior art. More specifically, the present inventor has recognized that by providing a well-defined notch filter phase characteristic over a bandwidth of interest, then the system will have a finite stable number of oscillation frequencies which can be notched. In order to obtain the goal of a well-defined phase characteristic for the system, a moving-average filter, sometimes referred to as a finite impulse response filter or a non-recursive filter, has been chosen to implement the notch filter for sound amplification applications.

The basic moving-average filter formulation is:

$$Y_K = \sum_{i=0}^{M} b_i X_{K-i-S} \qquad (9)$$

where $Y_K$ is the output, the b's represent coefficients for the filter, the X's are input samples, S is a constant, and the samples are summed from the sample $K-S$ through the sample $K-S-M$. For purposes of the following discussion, it will be assumed that $S=0$. A variety of different design techniques are available for effecting a moving-average notch filter. By way of example, Sections 3.7 through 3.40 of the reference "Theory and Applications of Digital Signal Processing," by L. R. Rabiner and B. Gold, Prentiss Hall, Inc., Englewood Cliffs, N.J. 1975, discloses several different moving-average design techniques.

Although the present invention is not limited to any particular moving-average design technique, a design technique for a simple notch filter will be illustrated, by way of example.

This design technique is implemented by first rewriting the equation (9) with z transforms, where $z=e^{j2\pi fT}$.

$$Y(z) = z^{-S}(b_0 X(z) + b_1 z^{-1} X(z) + \ldots + b_M z^{-M} X(z)) \qquad (10)$$

Z transform analysis is the normal means of computing the frequency response in a discrete time domain. In this regard, the unit circle obtained in the utilization of this analysis is analogous to the $j\omega$ axis in a Fourier analysis. By factoring the term $X(z)$ from equation (10) we obtain the following equation:

$$Y(z) = X(z) z^{-S}(b_0 + b_1 z^{-1} + b_2 z^{-2} + \ldots + b_M z^{-M}) \qquad (11)$$

By dividing both sides of the equation (11) by $X(z)$, equation (11) becomes:

$$H(z) = \frac{Y(z)}{X(z)} = z^{-S}(b_0 + b_1 z^{-1} + \ldots + b_M z^{-M}) \qquad (12)$$

By placing one or more of the zeros of the function $H(z)$ on the unit circle, a simple notch filter frequency response is realized. Thus, if we now choose the b's such that $(b_0 + b_1 z^{-1} + \ldots + b_M z^{-M}) = 0$ for $z_N = e^{j2\pi f_N T}$, then a notch filter frequency response is obtained with the notch located at the frequency $f_N$ and with the sample frequency $f_S$ equal to $1/T$. A variety of computer programs are available for obtaining solutions for the b coefficients. By way of example, this equation could be solved in accordance with the reference "A Computer Program for Designing Optimum FIR Linear Phase Digital Filters," by J. H. McClellan, T. W. Parks and L. R. Rabiner, IEEE Transactions on Audio and Electroacoustics, Vol. AU-21, pages 506–526, December 1973, which sets forth a detailed Fortran computer program for designing FIR digital filters. Another computer program which could be utilized to obtain solutions for the above-noted equation is set forth in the article "Statistical Design of Non-recursive Digital Filters," by D. C. Farden and L. L. Scharf, IEEE Transactions on Acoustics, Speech and Digital Processing, Vol. ASSP-22, No. 3, June 1974, pages 188–196, which discloses a second Fortran routine for use in the design of moving-average digital filters.

Additional requirements may be imposed on the solution for the b coefficients by means of the computer program. For example, it is generally desirable to have the transfer function $H(z)$ be fairly constant for frequencies on either side of the notch frequency $f_N$. By way of example, if a notch with the boundaries $\pi/8+0.01-\pi/8+0.03$ is to be inserted into the frequency response, with the frequency response above and below this notch being a 1, then the following table would merely be inserted into the computer.

$H(f)=1$ for 0 to $\pi/8$ radians
$H(f)=0$ for $\pi/8+0.01$ to $\pi/8+0.03$ radians
$H(f)=1$ for $\pi/8+0.03$ to $\pi$ radians In many applications it is desirable to have a notch filter with a linear phase characteristic. In order to obtain such a linear phase characteristic, the limitation $b_i = b_M - i$ for all i should be inserted into the computer. This symmetry limitation is discussed in more detail at page 78 of the Rabiner and Gold reference, noted above. The insertion of this symmetry limitation into the computer program will yield a phase characteristic of the form $\theta(\omega) = -(N-1/2)\omega$. From a review of this equation, it can be seen that the linear phase characteristic of the filter is dependent only on the number of coefficients N used in the system.

Thus, the sum total of all of the above-noted requirements can be translated into a desired frequency response, and that information written into a computer program. The notch filter designed in accordance with the foregoing method is capable of approximating zero to any desired degree at a predetermined fraction of the sample frequency $f_S$ or $1/T$. The notch frequency $\omega_N$, i.e., $2\pi f_N$, can be located anywhere in the region $[0, \pi]$. Typically, the notch frequency $\omega_N$ will be set to less than $\pi/8$ to allow for a relatively high sample frequency in order to maintain signal fidelity.

With the notch filter designed in accordance with the above-noted method, the phases $\theta_{FB}(f)$, $\theta_{HA}(f)$, and $\theta_{NOTCH}(f)$ will have a well-defined phase response thereby limiting the number of possible oscillation frequencies to a finite set in accordance with equations 6 and 7. Thus, it is possible to virtually eliminate the frequency response of the notch filter for this finite set of oscillation frequencies.

Figure 6:
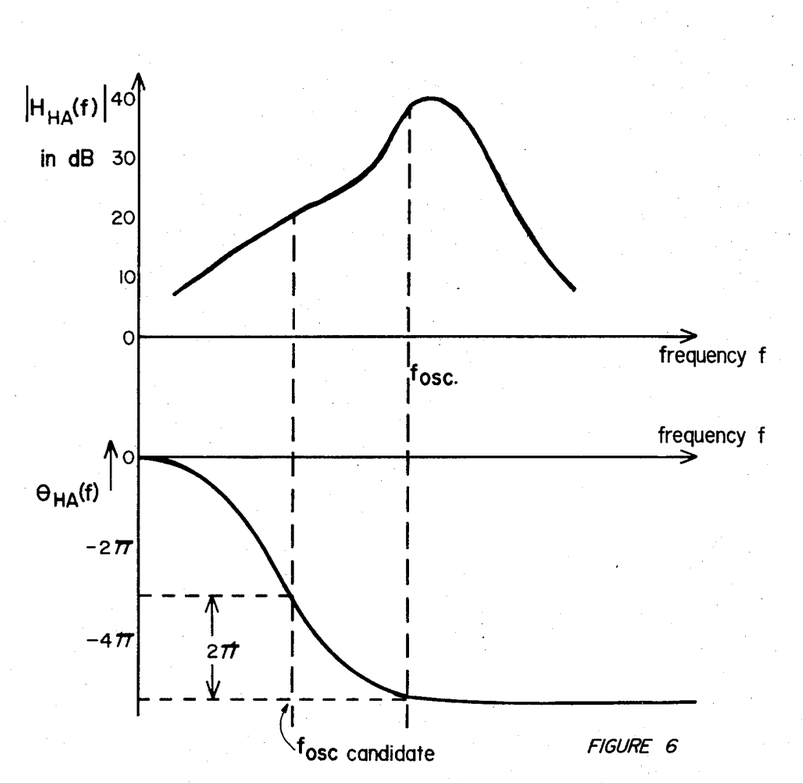
FIG. 6 is a graphical representation of the location of an oscillation frequency in the magnitude and phase plots for a typical hearing aid transfer function.

Due to the nature of the typical sound system frequency response $|H_{HA}(f)|$ and $\theta_{HA}(f)$, the practical set of oscillation frequencies generally comprises only a single frequency. FIG. 6 shows this oscillation frequency $f_{OSC}$ in conjunction with a typical hearing aid transfer function. The next possible candidate for oscillation according to equation (7) is a frequency which is a multiple of $2\pi$ away from the frequency of oscillation $f_{OSC}$. This frequency can be found by utilizing the phase response portion of FIG. 6. For a typical hearing aid, this oscillation candidate has a gain characteristic which is substantially lower than the initial oscillation frequency $f_{OSC}$. Thus, normally there is only one frequency of oscillation. However, in those cases where it is desired to have a substantial increase in overall gain, this oscillation frequency candidate will become a second oscillation frequency. This second oscillation frequency can be compensated merely by designing a second notch into the transfer function of the notch filter. It should be noted that this second notch could also be utilized to eliminate certain kinds of environmental noise. More specifically, this second notch could be utilized to remove environmental noise having a narrow frequency characteristic.

Figure 7:
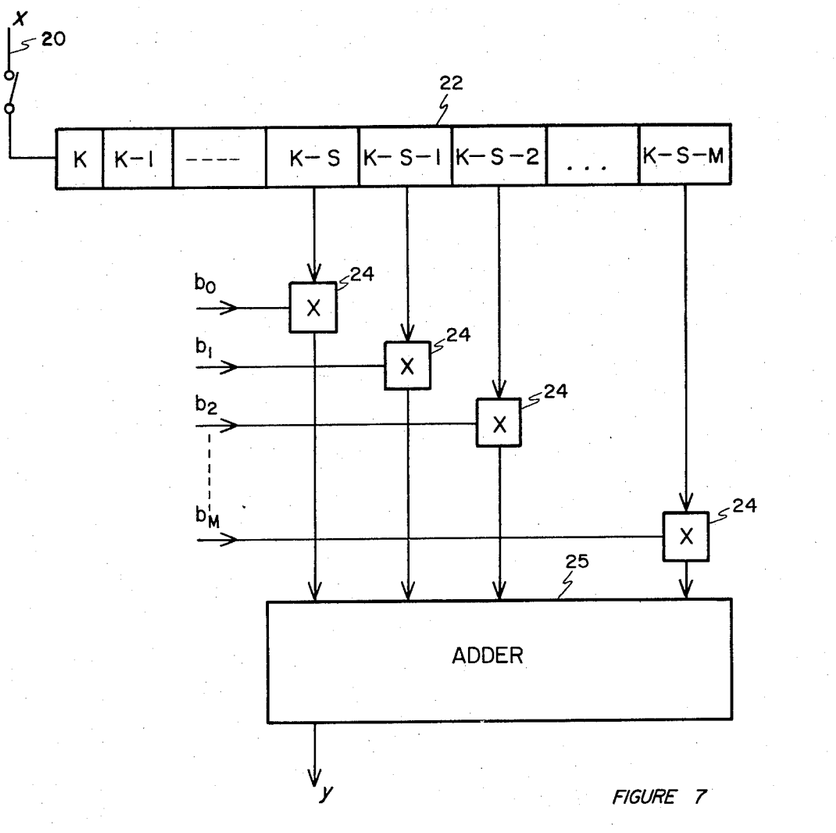
FIG. 7 is a schematic block diagram of one method of implementing the moving-average filter of the present invention.

Referring now to FIG. 7, there is shown a basic block diagram implementation for one embodiment of the present moving-average notch filter. An input X is applied on line 20 and then sampled which forms the input to a sequential memory 22. This memory device 22 operates to shift the input sample sequentially through a plurality of memory locations K through K−S−M where S is a constant, and M is a constant equal to the number of coefficients minus one. This shifting of of data in the memory from the addresses K to K−S−M is accomplished under control of pulses from a clock signal (not shown). For each of the memory locations K−S through K−S−M, the data held therein is applied to a respective multiplier for that memory location wherein it is multiplied by a weighting coefficient $b_i$, where $0 \leq i \leq M$. Each of the weighted outputs from the multipliers 24 is applied to an adder 26, which adds the respective multiplier 24 outputs to obtain an output signal Y proportional to the sum thereof.

It should be noted that the constant S merely determines which set of consecutive memory locations will be weighted and applied to the adder. Thus, the setting of S to an integer not equal to zero causes older stored values to be utilized in the weighting and adding process. In other words, a delay period is inserted before the newest input sample is utilized in the weighting and adding calculation. Clearly, the simplest case for this device would be implemented with S=0.

From a review of the above discussion, it can clearly be seen that the output Y from the block diagram shown in FIG. 7 will comprise equation (9). This process of multiplying the input samples $X_{K-S}$ by $b_0$, $X_{K-S-1}$ by $b_1$, through $X_{K-S-M}$ by $b_M$ is sometimes referred to as the linear convolution of the $X_K$ sequence with the $b_i$ sequence. On each clock pulse, a new input sample is applied to the storage location K and the data in each one of the storage locations is shifted to the next adjacent storage location and the weighting and addition sequences performed to obtain a $Y_K$ output. This procedure is repeated over and over, producing for every additional input sample, one additional output sample, according to the equation (9). For S=0, this operation essentially reduces to utilizing the new input sample $X_K$ to obtain the new output sample $Y_K$ while at the same time, discarding the oldest input sample $X_{K-M}$ that was used in the previous step.

The above realization of equation (9) shown in FIG. 7, is referred to as the direct form realization. Equation (9) can be realized in a variety of different forms. In this regard, see page 40 of the Rabiner and Gold reference noted above. The blocks K, K−1, ... K−S−M can among others be realized utilizing tapped delay lines, discrete time memories, and digital computer storage.

Figure 8:
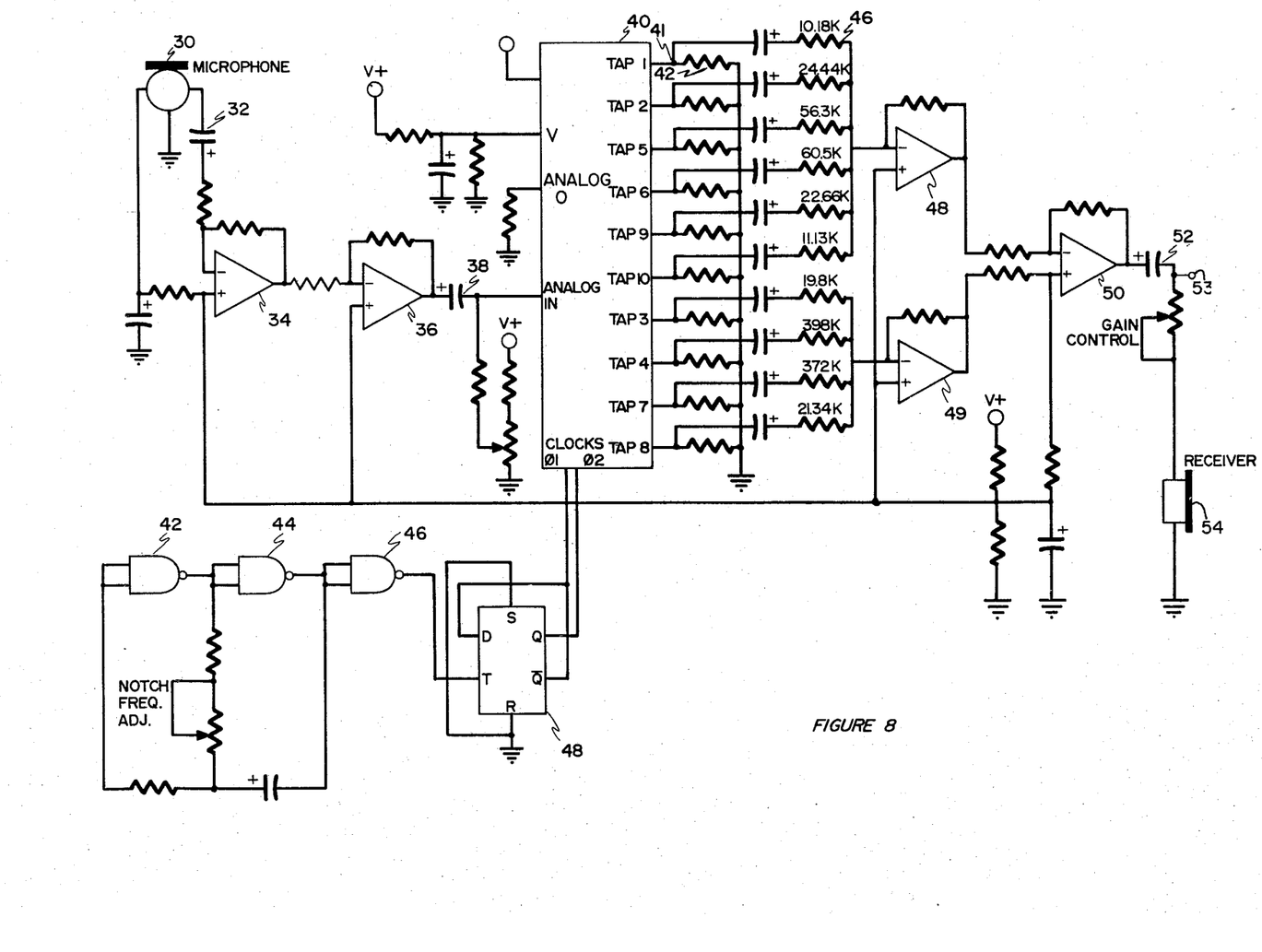
FIG. 8 is a schematic circuit diagram implementing FIG. 7.

Referring now to FIG. 8, a circuit implementation of the block diagram shown in FIG. 7 is disclosed. A transducer 30 is provided for generating an electrical signal in accordance with sound-wave excitations in the environment. By way of example, this transducer could comprise a Knowles 1750 microphone. The output signal from the transducer 30 is applied via a coupling capacitor 32 to the negative input of an operational amplifier 34 biased in an amplification configuration. The output from the amplifier 34 is applied to the negative input of a second operational amplifier 36 which is also biased in an amplification configuration. The output from the second operational amplifier 36 is applied by means of a coupling capacitor 38 to the analog input of a tapped delay line 40. By way of example, this delay line may be implemented with a Reticon tapped delay line with 32 taps. (Only ten taps are shown and used in the figure). Thus, in the particular implementation shown, the number of coefficients $M+1=10$. This tapped delay line 40 is operated under the control of clock signals $\Phi_2$ and $\Phi_1$.

There are a variety of methods of generating clock signals. The particular method utilized in the present implementation includes a connection of NAND gates 42 and 44 in a feedback configuration such that an oscillation frequency is obtained in accordance with the values of the resistors and capacitor shown in the feedback loop for these NAND gates. The oscillation frequency obtained from the NAND gate 44 is applied to a third NAND gate 46 which operates to invert and shape the signal. The output from the NAND gate 46 is applied to the T input of a D-type flip-flop 48. The flip-flop 48 operates to halve the frequency that appears at its input. The $\overline{Q}$ output of the flip-flop 48 is applied to the delay line 40 as the $\Phi_2$ clock signal. The Q output of the flip-flop 48 is applied to the delay line 40 as the $\Phi_1$ clock signal. By way of example, the above-noted NAND gates can be implemented by utilizing one-quarter of a quad two-input NAND chip MC14011 from Motorola Corporation, and the flip-flop 48 can be implemented by utilizing one-half of a dual D-type flip-flop chip CD 4013 from RCA CD4013.

Referring again to the tapped delay line 40, the data sample held at each TAP location is shifted upward to a higher TAP number under control of the clock signal inputs from the flip-flop 48. The newest input sample from the analog input of the tapped delay line 40 is applied to the vacated TAP 1 location. Likewise, the oldest sample located in TAP 32 is deleted. An output signal from each tap flows through the resistor 43 to ground. The AC voltage at the junction point 41 will be proportional to the input sample held in the TAP. This voltage is applied via a blocking capacitor 45 to the respective weighting resistor 47 for that particular TAP. The values for these weighting resistors 47 are determined in accordance with the following equation:

$$\frac{R_{TAPi+1}}{R_{TAPj+1}} \text{ (Multiplication Factor)} = \frac{b_j}{b_i} \quad 0 \leq i,j \leq M \qquad 13$$

By way of example, the weighting resistors for a particular set of b coefficients determined in accordance with the McClellan, Parks, and Rabiner computer program noted above is set forth on the drawing. In the figure, the TAP 1 represents the TAP or memory storage $X_K$ (assuming S=0), the memory storage location for the newest input sample. Likewise, the TAP 2 represents the memory storage K−1, and so on. The weighted signals from the TAPs 1-10 are summed in the operational amplifiers 49 and 51. Two amplifiers are used in this circuit because some of the weighted inputs need to be negative. Thus, one adder sums the positive weighted inputs, while the other adder sums the negative weighted inputs. The output signals from the amplifiers 49 and 51 are applied to the negative and positive inputs of the operational amplifier 50, which is connected in a differential amplifier configuration. The amplifier 50 subtracts one input from the other and applies its output via a coupling capacitor 52 to a speaker 54.

By way of example, the speaker 54 may comprise a Knowles BK1604 receiver. Likewise, the operational amplifiers 34, 36, 49 and 51 may comprise Raytheon chips RC4156 (only one-fourth of the chip is needed for each operational amplifier. The operational amplifier 50 may comprise one-half of a Raytheon chip RC4558. It should be noted that the tapped delay line 40 and the weighting configuration 43, 45 and 47 could alternatively be implemented by means of a RETICON R5602 Transversal Filter. In the present configuration, all of the integrated circuit chips were energized with one +9 V battery cell.

It should again be emphasized that there is a wide variety of techniques for implementing equation (9). The particular configurations shown in FIG. 7 in block diagram form, and in FIG. 8 in schematic circuit form, comprise only one technique out of many that could be used for implementing equation (9). Thus, the present invention is in no way limited to this particular block diagram and circuit implementation.

It should be noted that the feedback path characteristics (the feedback transfer function) shown in FIG. 1, may drift or change with time. In such cases, it is desirable to have a notch filter which automatically adjusts its notch location in the filter frequency response so that it tracks the feedback oscillation frequency changes.

Figure 9:
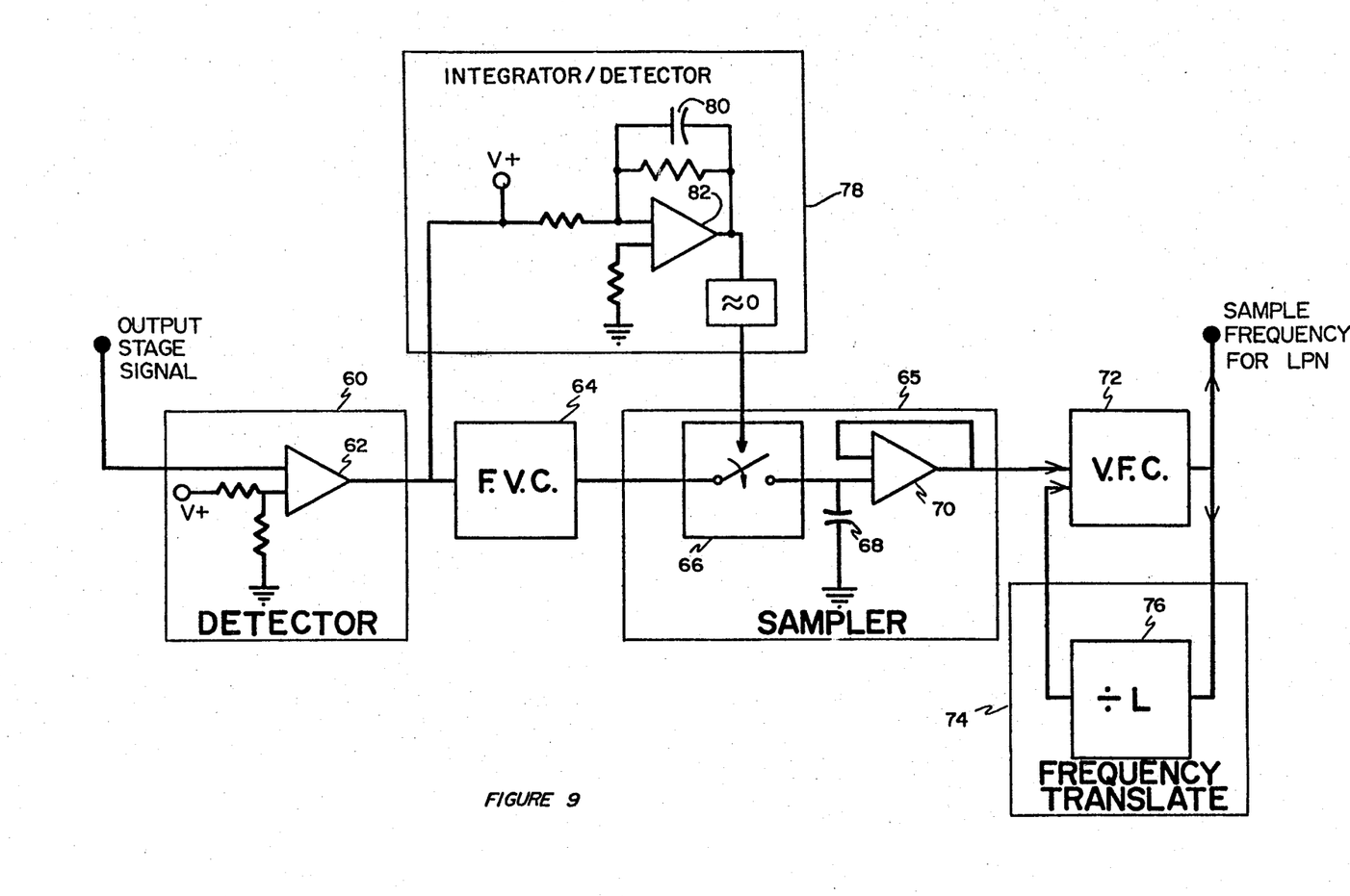
FIG. 9 is a schematic circuit diagram implementing automatically adjustable control of the notch location of the circuit of FIG. 7.

The circuit shown in FIG. 9 is one implementation for a control system for an automatically adjustable notch filter. It should be noted at the outset, that a notch in the frequency response of digital filters and discrete-time filters can be shifted in frequency by varying the sampling frequency or clock frequency controlling the filter. This can be seen by noting that the moving-average notch filter of the present invention will have a transfer function in accordance with the following equations:

$$H(z) = \text{polynominal in } z \text{ for } z = e^{j2\pi f/f_s}, 0 \leq f \leq f_s/2 \quad (14)$$
$$= b_0 + b_1 z^{-1} + b_2 z^{-2} \ldots + b_M z^{-M}$$

In this equation, the sampling period T has been substituted by $1/f_s$, the reciprocal of the sampling frequency. Thus, it can be seen that if the sampling frequency $f_s$ is changed to a different value, such as for example $2f_s$, then the transfer function for the changed moving-average notch filter will have the same gain and phase response as that for the original sampling frequency $f_s$ but now at double the frequency of the original. In other words, the location of the notch has been changed from the frequency $f_N$ to the frequency $2f_N$. From the foregoing discussion of FIGS. 7 and 8, it can be seen that the sampling frequency $f_s$ can be changed by merely changing the clock frequency controlling the memory device 22 of FIG. 7 or the tapped delay line 40 of FIG. 8. In the implementation of FIG. 8, the frequency controlled clock signal could merely be applied to the T input of the flip-flop 48 instead of the oscillator circuit shown in FIG. 8.

There are a variety of techniques for effecting this adaptive control of the clock sampling frequency for the digital notch filter. The circuit in FIG. 9 is based on the assumption that a feedback oscillation signal is relatively large in amplitude and has rather evenly spaced zero-crossings. Thus, the output signal $Y_K$ from the moving-average notch filter is applied to a detector 60 comprising an operational amplifier 62. The operational amplifier 62 is properly biased at its input such that it will detect only signals having a voltage amplitude above a particular threshold voltage. This threshold voltage is usually set such that the detector 60 will detect only signals using almost all of the total dynamic range of the system. The square wave output from the operational amplifier 62 is applied to a frequency-to-voltage converter 64 which operates to generate a voltage proportional to this oscillation frequency. The voltage output from the frequency-to-voltage converter 64 is then applied to a sampler 65 comprising a switch 66, a capacitor 68, and an operational amplifier 70. The voltage signal from the frequency-to-voltage converter 64 charges the capacitor 68 when the switch 66 is initially closed. The capacitor 68 acts as a memory element to memorize the voltage proportional to the last feedback frequency applied from the frequency-to-voltage converter 64. The voltage on the capacitor 68 will be maintained until the switch 66 is again closed. At that time, the voltage on the capacitor 68 will either be charged to a higher level or discharged to a lower level in accordance with the voltage applied from the frequency-to-voltage converter 64. Thus, the voltage on the capacitor 68 is always representative of the oscillation feedback frequency generated by the frequency-to-voltage converter 64 on the most recent closing of the switch 66. The operational amplifier 70 is connected in a voltage follower configuration such that a high load impedance is presented to the capacitor 68 to thereby prevent leakage of the capacitor voltage. The output of the voltage follower 70 is a voltage representative of the voltage held on the capacitor 68. This output voltage from the voltage follower 70 is applied to a voltage-to-frequency converter 72 which operates to generate a control signal frequency for application to the T input of flip-flop 48 instead of the oscillator circuit shown in FIG. 8. In the present implementation, the frequency that would be generated in accordance with the output from the amplifier 70 is not sufficient to properly control the clock oscillator. Thus, a frequency translator 74 comprising a digital divider 76 is included in the circuit. This circuit essentially forces the voltage-to-frequency converter 72 to generate a control frequency $f_C$ proportional to the input voltage from the amplifier 70 multiplied by a constant L. This multiplication is accomplished by taking the output signal from the voltage-to-frequency converter 72 and applying it to a digital divide-by-L circuit 76, to thereafter apply this in frequency divided signal to the control input of the block 72.

It should be noted that certain loud speech sounds with amplitudes using the total dynamic range of the system will also be detected by the detector 60. In order to prevent the utilization of these loud speech sounds in the adaptive control of the notch, an integrator/detector circuit 78 is included. The inclusion of this integrator/detector circuit 78 is based on the assumption that a feedback oscillation signal will have regularly spaced zero crossings and will therefore produce output pulses at extremely regular intervals from the detector 60. Thus, the circuit 78 is designed to possibly close the switch 66 only after a certain fixed number of detected pulses have been applied to the integrator. The integrator 78 comprises an operational amplifier 82 with a capacitor 80 connected to its input terminal such that it is in an integrator configuration. The output from the detector 60 is applied to this input terminal of the amplifier 82. Whenever in the particular configuration shown in FIG. 9, a genuine feedback oscillation signal occurs, a fixed number of positive and negative pulses will be applied to the integrator such that the integrator output voltage is close to zero. A close to zero voltage output from the integrator 78 will close switch 66 via a detector. When the switch 66 is closed, the voltage output from the frequency-to-voltage converter 64 is applied to the capacitor 68 to charge or discharge that capacitor to a voltage proportional to a new feedback oscillation frequency in accordance with the above discussion. This new feedback oscillation frequency will then be applied to the voltage-to-frequency converter 72 to generate a frequency that controls the sample frequency for the circuit shown in FIG. 8.

The frequency-to-voltage converter 64 and the voltage-to-frequency converter 72 may be implemented, by way of example, by Raytheon chips 4151. These converters could also be implemented by the RCA COS/MOS Micropower Phase Lock Loop chip CD 4046 which includes a frequency-to-voltage converter, a voltage-to-frequency converter, and the capability of frequency translation on a single chip.

While I have shown and described several embodiments in accordance with the present invention, it is understood that the same is not limited thereto but is susceptible to numerous changes and modifications as known to those skilled in the art and I therefore do not wish to be limited to the details shown and described herein but intend to cover all such changes and modifications as are encompassed by the scope of the appended claims.

I claim:
1. A sound amplification system comprising:
first transducer means for providing a signal in accordance with sound-wave excitations in the environment;
amplification means for amplifying said signal;
filter means having a notch therein corresponding to an oscillation frequency of said signal which is to be suppressed; and
second transducer means for converting the output from the filter means into excitations detectable by a listener,
wherein the improvement comprises said filter means being a moving-average filter means having a frequency response with at least one notch therein, the output $Y_K$ of said moving-average filter being derived in accordance with the system equation

$$Y_K = \sum_{i=0}^{M} b_i X_{K-i-S}$$

wherein the b's are weighting coefficients, the X's are input samples from said amplification means, S and K are constants, and each output $Y_K$ is composed of M+1 samples, and wherein the phase characteristic of said moving-average filter means is well-defined in the vicinity of and at said notch to limit the number of possible oscillation frequencies at the notch to a finite number,
wherein said moving-average filter means further comprises:
clock means for generating a clock signal;
memory means for sampling the output from said amplification means in accordance with said clock signal and for storing and shifting at least M+1 samples in accordance with said clock signal; and
automatic clock control means for controlling the frequency of said clock signal in accordance with the output from said moving-average filter means to thereby control the location of said at least one notch in the frequency response of said moving-average filter means.

2. A sound amplification system as defined in claim 1, wherein said moving-average filter means includes means for making said phase characteristic linear.

3. A sound amplification system as defined in claim 1, wherein said moving-average filter means comprises:
memory means for holding at least M+1 input samples;
weighting means for individually weighting each of said M+1 input samples in accordance with their location in said memory means;
summing means for adding the weighted M+1 input samples and applying a signal representative of this sum as the output $Y_K$ of said moving-average filter means; and
clock means for generating a clock signal for controlling said memory means to sample the output from said amplification means to obtain a new input sample and for properly shifting the M+1 input samples stored in said memory means such that the input sample stored at K−i−S is stored in the memory location K−i−S−1, where 0≦i≦M+1, and the newest input sample is stored in the memory location K and the oldest stored input in K−N−S is dropped.

4. A sound amplification system as defined in claim 3, wherein said memory means comprises a tapped delay line with M+1 taps.

5. A sound amplification system as defined in claim 1, wherein said automatic clock control means comprises:
means for recognizing a feedback oscillation frequency in the output of said moving-average filter means;
first means for generating a signal proportional to said oscillation frequency; and
second means for generating a control signal in accordance with said signal proportional to said oscillation frequency for controlling the frequency of said clock signal.

6. A sound amplification system as defined in claim 5, wherein said first means comprises a frequency-to-voltage converter for generating a voltage proportional to the frequency of selected output signals from said moving-average filter means, and a switch for applying the voltage signals generated by said first means to said second means;
wherein said recognizing means is connected to the output of said moving-average filter means for providing a predetermined output signal when an oscillation frequency is present to close said switch; and wherein said second means comprises a voltage-to-frequency converter for converting the output voltage applied from said frequency-to-voltage converter by means of said switch to a frequency for controlling said clock means.

7. A sound amplification system as defined in claim 6, wherein said first means further includes a memory for storing the output voltage from said frequency-to-voltage converter applied during the most recent closing of said switch, and means for applying this stored voltage to said voltage-to-frequency converter.

8. A sound amplification system as defined in claim 7, wherein said first means further includes a detector connected to the output of said moving-average filter means for generating a signal only when said filter output is above a threshold value.

9. A sound amplification system as defined in claim 8, wherein said recognizing means includes an integrator/detector for closing said switch when the output from said integrator is near zero after integrating a number of pulses from said threshold value detector.

10. A sound amplification system comprising:
first transducer means for providing a signal in accordance with sound-wave excitations in the environment;
amplification means for amplifying said signal;
filter means having a notch therein corresponding to an oscillation frequency of said signal which is to be suppressed; and
second transducer means for converting the output from the filter means into excitations detectable by a listener,
wherein the improvement comprises said filter means being a moving-average filter means having a frequency response with at least one notch therein, the output $Y_K$ of said moving-average filter being derived in accordance with the system equation $$Y_K = \sum_{i=0}^{M} b_i X_{K-i-S}$$

wherein the b's are weighting coefficients, the X's are input samples from said amplification means, S and K are constants, and each output $Y_K$ is composed of M+1 samples, and wherein the phase characteristic of said moving-average filter means is well-defined in the vicinity of and at said notch to limit the number of possible oscillation frequencies at the notch to a finite number, and
means for automatically controlling the location of said at least one notch in the response of said moving-average filter means in accordance with the output from said moving-average filter,
wherein said moving-average filter means comprises:
clock means for generating a clock signal; and
memory means for sampling the output from said amplification means in accordance with said clock signal and for storing and shifting M+1 samples also in accordance with said clock signal, and
wherein said controlling means comprises automatic clock control means for controlling the frequency of said clock signal in accordance with the output from said moving-average filter means to thereby control the location of said at least one notch in the frequency response of said moving-average filter means.

11. A sound amplification system as defined in claim 10, wherein said automatic clock control means comprises:
means for recognizing a feedback oscillation frequency in the output of said moving-average filter means; and
means for generating a control signal from said detected feedback oscillation frequency for controlling said clock signal.

12. A sound amplification system as defined in claim 10, wherein said automatic clock control means comprises:
a detector for detecting only output signals from said moving-average filter means above a predetermined threshold;
an integrator/detector for determining when the output from said detector occurs at regularly spaced intervals in time; and
means for generating a control signal from the output from said detector when this detected output occurs at regularly spaced intervals in time to control said clock signal.

13. A sound amplification system as defined in claim 12, wherein said generating means comprises:
a frequency-to-voltage converter for generating a voltage proportional to the output frequency from said detector;
a switch controlled in accordance with the output from said integrator/detector;
a memory for storing the voltage value from said frequency-to-voltage converter supplied during the most recent closing of said switch by said integrator/detector; and
a voltage-to-frequency converter for generating a control voltage in accordance with the voltage stored in said memory for application to said clock means.

14. A sound amplification system for a hearing aid comprising:
a microphone;
an amplifier for amplifying the output signals from said microphone;
a filter having a notch therein corresponding to an oscillation frequency of said amplifier signals which is to be suppressed; and
a speaker for converting the output signal from said filter into excitations detectable by a listener,
wherein the improvement comprises said filter being a moving-average filter having a frequency response with at least one notch therein, the phase characteristic of the transfer function for said moving-average filter being well-defined in the vicinity of and at said notch to limit the number of possible oscillation frequencies at the notch to a finite number, and
means for automatically controlling the location of said at least one notch in the response of said moving-average filter in accordance with the output from said moving-average filter,
wherein said moving-average filter comprises:
clock means for generating a clock signal; and
memory means for sampling the output from said amplifier in accordance with said clock signal and for storing at least M+1 samples, and
wherein said controlling means comprises automatic clock control means for controlling the frequency of said clock signal in accordance with the output from said moving-average filter to thereby control the location of said at least one notch in the frequency response of said moving-average filter.

15. An amplification system as defined in claim 14, wherein said moving-average filter includes means for making said phase characteristic linear.

16. An amplification system as defined in claim 14, wherein said moving-average filter comprises:
   memory means for holding at least $M+1$ input samples;
   weighting means for individually weighting each of said $M+1$ input samples in accordance with their location in said memory means;
   summing means for adding the weighted $M+1$ input samples and applying a signal representative of this sum as the output of said moving-average filter; and
   clock means for generating a clock signal for controlling said memory means to sample the output from said amplifier to obtain a new input sample and for properly shifting the $M+1$ input samples stored in said memory means such that each input sample stored at memory location $K-i$ is now stored in the memory location $K-i-1$, where $0 \leq i \leq M+1$, and the newest input sample is stored in the memory location K and the oldest stored input sample is dropped.

17. An amplification system as defined in claim 16, wherein said memory means comprises a tapped delay line with $M+1$ taps.

18. An amplification system as defined in claim 14, wherein said automatic clock control means comprises:
   means for recognizing a feedback oscillation frequency in the output of said moving-average filter; and
   means for generating a control signal from said detected feedback oscillation frequency for controlling said clock signal.

19. An amplification system as defined in claim 14, wherein said automatic clock conftrol means comprises:
   a detector for detecting only output signals from said moving-average filter above a predetermined threshold;
   an integrator/detector for determining when the output from said detector occurs at regularly spaced intervals in time; and
   means for generating a control signal from the output from said detector when this detected output occurs at regularly spaced intervals in time to control said clock signal.

* * * * *